OPERATIONAL AMPLIFIER
Filed Sept. 26, 1967
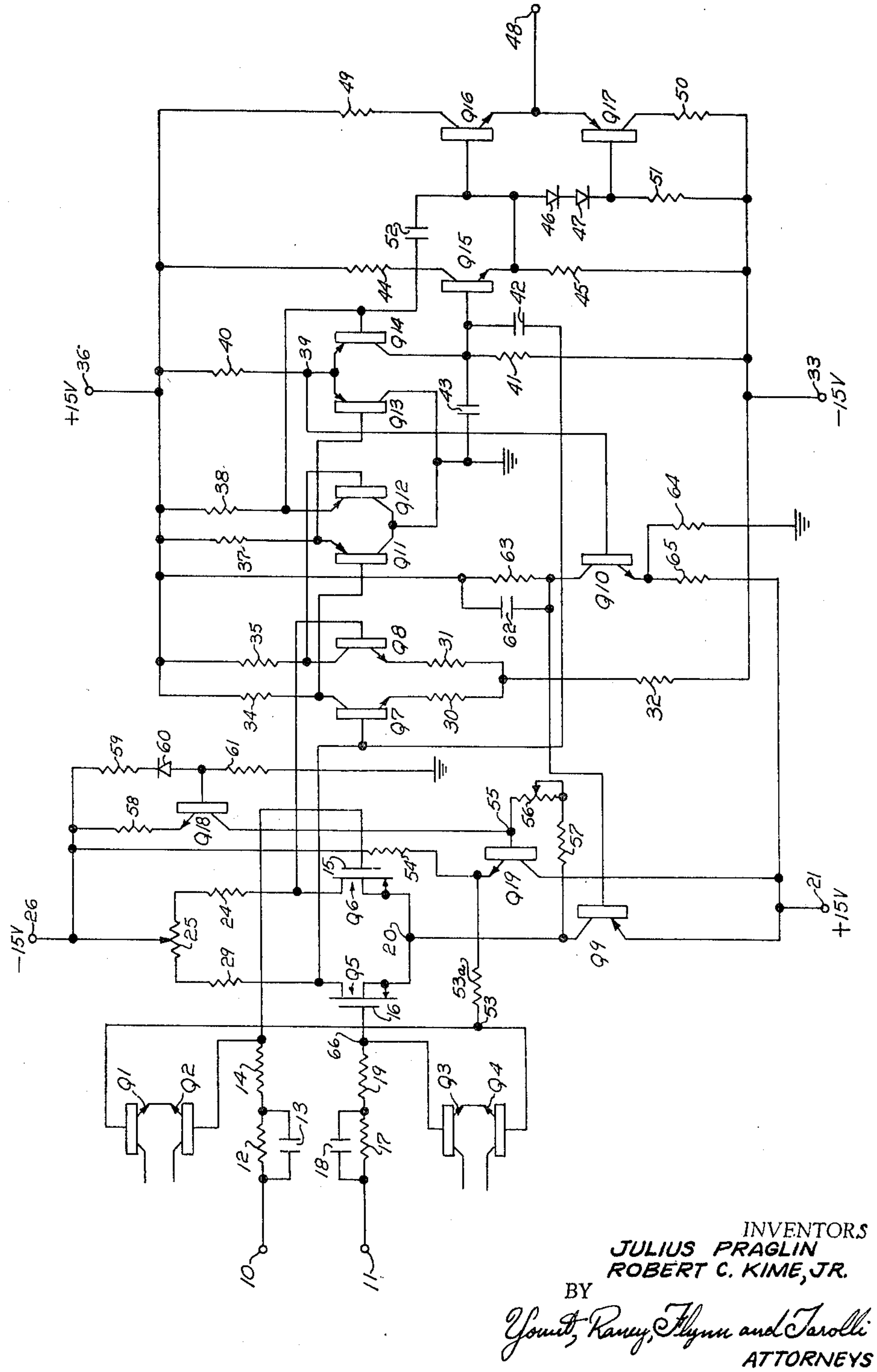
INVENTORS
JULIUS PRAGLIN
ROBERT C. KIME, JR.
BY
Yount, Raney, Flynn and Tarolli
ATTORNEYS United States Patent Office 3,474,347
Patented Oct. 21, 1969

3,474,347
OPERATIONAL AMPLIFIER

Julius Praglin, Beachwood, and Robert C. Kime, Jr., Fairview Park, Ohio, assignors to Keithley Instruments, Inc., Solon, Ohio, a corporation of Ohio Filed Sept. 26, 1967, Ser. No. 670,586
Int. Cl. H03f *1/14*
U.S. Cl. 330—27 26 Claims

ABSTRACT OF THE DISCLOSURE

The present operational amplifier has a pair of insulated-gate field effect transistors in its input, each protected against overload input signals by a pair of back-to-back base-emitter junctions provided by transistors having open-circuited collectors. Bypass current through these junctions caused by common mode input signals is minimized by minimizing the voltage across them through circuitry which includes a control transistor having one of its output electrodes connected directly to the source electrode of the input transistors and its other output electrode connected directly to a power supply terminal, an emitter-follower transistor driving the terminal of the back-to-back junctions remote from the amplifier inputs, and resistance means connected between a constant current source and the control transistor and controlling the output of the emitter-follower transistor so that the voltage at said terminal follows the voltage at the source elecrodes of the input transistors. The control transistor is stabilized through a feedback circuit driven by a subsequent stage of the amplifier. Three compensating capacitors are provided for stabilizing the amplifier at all signal frequencies. The amplifier has a single-ended output driven by a pair of output transistors which respectively conduct positive and negative currents, and the current through each output transistor is limited by current-limiting resistors in its collector-emitter and base-emitter paths to prevent damage in case the output terminal is short-circuited to ground or to a positive or negative power supply terminal.

This invention relates to an amplifier, and more particularly to an operational amplifier.

It is an important object of this invention to provide a novel and improved amplifier having a high input impedance provided by an insulated-gate field effect input transistor.

Another object of this invention is to provide such an amplifier having novel provision for protecting the input transistor against overload input signals.

Another object of this invention is to provide such an amplifier in which overload input signals are bypassed through a pair of back-to-back base-emitter junctions provided by transistors which have open-circuited collectors, with the reversely-biased junction of the pair going into Zener breakdown.

Another object of this invention is to provide such an amplifier having a novel provision for minimizing the voltage across the pair of junctions, to thereby minimize the bypass current, in response to an input signal within the linear operating range of the input transistor.

Another object of this invention is to provide an amplifier having a novel and improved arrangement of compensating capacitors for stabilizing the amplifier at all signal frequencies.

Another object of this invention is to provide a novel and improved operational amplifier having in its input a pair of insulated-gate field effect transistors which are protected against overload input signals in an improved manner.

Another object of this invention is to provide such an operational amplifier having novel provision for limiting input currents which bypass the input transistors and which are caused by common mode input signals to the input transistors.

Another object of this invention is to provide an improved operational amplifier, having a single-ended output, which is protected against damage in the event that its output is short-circuited.

Further objects and advantages of this invention will be apparent from the following detailed description of a presently-preferred embodiment thereof, which is illustrated by the schematic circuit diagram depicted in the single figure of the accompanying drawing.

Referring to the drawing, the present operational amplifier has a pair of input terminals 10 and 11 to which differential input signals are applied. Input terminal 10 is connected through a parallel-connected resistor 12 and capacitor 13 and a current-limiting resistor 14 in series with them to the gate electrode 15 of a first insulated-gate field effect transistor Q6 whose bias is of the same polarity as that of a PNP transistor. The second input terminal 11 is connected to the gate electrode 16 of an identical second insulated-gate field effect transistor Q5 through a parallel-connected resistor 17 and capacitor 18 and a current-limiting resistor 19 in series with them.

The two input transistors Q5 and Q6 have their respective source electrodes connected directly to a junction point 20, which is connected through the emitter-collector path of a control transistor Q9 to a +15 volt power supply terminal 21. Control transistor Q9 acts as a constant current source for the input transistors Q5 and Q6.

The drain electrode of input transistor Q6 is connected through a resistor 24 and the right side of a potentiometer 25 to a −15 volt power supply terminal 26. Similarly, the drain electrode of input transistor Q5 is connected through a resistor 29 and the left side of potentiometer 25 to the negative power supply terminal 26.

Both input transistors Q5 and Q6 have a very high input impedance, on the order of $10^{16}$ or $10^{17}$ ohms, as well as a very low input leakage current, on the order of $10^{-16}$ ampere, and they provide the first voltage amplification stage in the present amplifier. This type of transistor (i.e., the insulated-gate field effect transistor) is very susceptible to a static charge and it has a relatively low breakdown voltage, on the order of 25 volts, which, if exceeded, results in the destruction of the transistor. The present amplifier has novel provision for protecting the input transistors from these conditions, as explained hereinafter.

A second pair of transistors Q7 and Q8, both of the NPN type, provide the next voltage amplification stage in the amplifier. The base electrode of transistor Q7 is connected directly to the drain electrode of input transistor Q5. Similarly, the base electrode of transistor Q8 is connected directly to the drain electrode of input transistor Q6. The emitter electrodes of transistors Q7 and Q8 are connected through respective resistors 30 and 31 and a resistor 32 in series with the latter to a −15 volt power supply terminal 33. The collector electrodes of transistors Q7 and Q8 are connected through respective resistors 34 and 35 to a +15 volt power supply terminal 36.

A third pair of transistors Q11 and Q12, both of the PNP type, are connected for emitter follower operation to provide a current-amplifying third stage in the present amplifier. The base electrode of transistor Q11 is connected directly to the collector electrode of transistor Q7 in the second voltage amplification stage. Similarly, the base electrode of transistor Q12 is connected directly to the collector electrode of the other transistor Q8 in the second voltage amplification stage. The collector electrodes of both transistors Q11 and Q12 are connected to ground. The emitter electrodes of transistors Q11 and Q12 are connected through respective emitter follower resistors 37 and 38 to the positive power supply terminal 36.

A fourth pair of transistors Q13 and Q14, both of the PNP type, are connected to provide the third and final voltage amplification stage in the amplifier. The base electrode of transistor Q13 is connected directly to the emitter of Q11 in the preceding emitter follower stage. Similarly, the base electrode of transistor Q14 is connected directly to the emitter of transistor Q12. The emitter electrodes of transistors Q13 and Q14 are both connected directly to a junction point 39, which is connected through a resistor 40 to the positive power supply terminal 36. The collector electrode of transistor Q13 is connected directly to ground. The collector electrode of transistor Q14 is connected through a resistor 41 to the −15 volt power supply terminal 33.

A first compensating capacitor 42 is connected between the collector electrode of transistor Q14 and the base electrode of transistor Q7 in the second voltage amplification stage.

A second compensating capacitor 43 is connected between the collector electrode of transistor Q14 and the grounded collectors of the emitter follower transistors Q11 and Q12.

The collector electrode of transistor Q14 in the final voltage amplification stage is connected directly to the base electrode of a transistor Q15, which is connected for emitter follower operation. The collector electrode of transistor Q15 is connected through a resistor 44 to the positive power supply terminal 36. The emitter electrode of transistor Q15 is connected through a resistor 45 to the negative power supply terminal 33.

A third compensating capacitor 52 is connected between the emitter electrode of transistor Q15 and the base electrode of transistor Q14 in the final voltage amplification stage of the amplifier.

The emitter electrode of transistor Q15 is connected directly to the base electrode of a first output transistor Q16, and is connected through a pair of series-connected temperature-compensating diodes 46 and 47 to the base electrode of a second output transistor Q17. The emitter electrodes of transistors Q16 and Q17 are both connected directly to an output terminal 48. The collector electrode of transistor Q16 is connected through a resistor 49 to the positive power supply terminal 36. The collector electrode of transistor Q17 is connected through a resistor 50 to the negative power supply terminal 33. A resistor 51 is connected between the negative power supply terminal 33 and the base electrode of transistor Q17.

The output transistors provide complementary symmetry output and are arranged for substantially class B operation, with one conducting current while the other is non-conducting and vice versa.

The purpose of the compensating capacitors 41, 43, and 52 is to stabilize the amplifier, so that it cannot oscillate at any input signal frequency. Each stage of the amplifier produces a phase shift lag and, in the absence of these capacitors, at some particular frequency or frequencies at a loop gain above unity the total phase shift through several stages of the amplifier might add up to 180 degrees or more, making the amplifier susceptible to oscillation at this frequency or frequencies when negative feedback is applied. The first compensating capacitor 42, which is connected between the output of the third and final voltage amplification stage and the input of the second voltage amplification stage, serves as the main stopper in the amplifier, preventing oscillation from occurring throughout the low frequency range. The third compensating capacitor 52, which is connected between the emitter of the emitter follower transistor Q15 and the input of transistor Q14 in the third and final voltage amplification stage, prevents oscillation at the intermediate frequencies. The second compensating capacitor 43, which is connected between the collector of Q14 in the final voltage amplification stage and the grounded collectors of Q11 and Q12 in the current amplification stage, prevents oscillation at the high frequencies.

By appropriate choice of the values of these three compensating capacitors 42, 43 and 52, the amplifier has a roll-off of substantial 6 db per octave throughout the complete frequency range, so that it is stable for all feedback arrangements.

Another important aspect of the present invention is that the output of the amplifier is substantially short-circuit proof. That is, if the output terminal 48 is short-circuited inadvertently to ground or to either a positive or negative power supply terminal, this cannot damage the amplifier. For example, if the output terminal 48 is short-circuited to ground or to a negative power supply terminal while transistor Q16 is conducting positive current, the resistor 49 will limit the collector-emitter current in transistor Q16 and the resistor 44 will limit the base-emitter current in transistor Q16. Conversely, if the output terminal 48 is short-circuited to ground or to the positive power supply terminal while transistor Q17 is conducting negative current, the resistor 50 will limit the collector-emitter current in transistor Q17 and the resistor 51 will limit the base-emitter current in transistor Q17.

It will be noted that the protective current-limiting in either situation is performed by resistors, which are passive circuit elements.

Another important advantage of the present amplifier is that it is protected against various possible input signal conditions, such as excessive differential input voltages or excessive reverse leakage currents due to common mode input signals, by the novel circuit arrangement which will now be described.

A first pair of transistors Q1 and Q2 have their respective base-emitter junctions connected as back-to-back diodes to protect the first input transistor Q6 against overload input voltages. The base electrode of Q2 is connected directly to the gate electrode 15 of input transistor Q6. The emitter electrode of Q2 is connected directly to the emitter electrode of Q1. The base electrode of Q1 is connected directly to a junction point 53 in the amplifier circuit. The collector electrodes of both Q1 and Q2 are open-circuited, so that only the base-emitter junctions of Q1 and Q2 are effectively present in the circuit. The base-emitter junctions of these transistors Q1 and Q2 have much lower reverse currents than would be passed by conventional semiconductor diodes connected back to back in the same manner. The Zener breakdown voltage of Q1, at which it breaks down for positive current flow through its reversed-biased emitter-base junction, is appreciably lower than the breakdown voltage of the input transistor Q6 which it protects. Similarly, the Zener breakdown voltage of Q2, at which it breaks down for negative current flow through its reversed-biased base-emitter path, is appreciably lower than the breakdown voltage of input transistor Q6.

The base-emitter junctions of a similar pair of transistors Q3 and Q4 perform the same overload input voltage-bypassing function in the same manner for the other input transistor Q5 of the amplifier. The base electrode of Q3 is connected directly to the gate electrode of input transistor Q5. The emitter electrode of Q3 is connected directly to the emitter electrode of Q4. The base electrode of Q4 is connected directly to the aforementioned junction point 53. The collector electrodes of both Q3 and Q4 are open-circuited. The Zener breakdown voltage for Q3 and Q4, for negative and positive reverse current conductor, respectively, is appreciably lower than the breakdown voltage of the input transistor Q5 which they protect.

The junction point 53 is connected through a resistor *53a* to the emitter electrode of an NPN transistor Q19 connected for emitter follower operation. The collector electrode of transistor Q19 is connected directly to the positive power supply terminal 21. Its emitter electrode is connected through a resistor 54 to the negative power supply terminal 26. The base electrode of transistor Q19 is connected directly to a junction point 55 of the circuit.

Point 55 is connected through a potentiometer 56 and a resistor 57 to the previously-mentioned junction point 20, to which the source electrodes of both input transistors Q5 and Q6 are connected directly.

Point 55 also is connected through the collector-emitter path of an NPN transistor Q18 and a resistor 58 to the negative power supply terminal 26. A resistor 59 and a temperature-compensating semiconductor diode 60 are connected in series with each other between terminal 26 and the base electrode of transistor Q18. A resistor 61 is connected between the base electrode of transistor Q18 and the chassis ground. Transistor Q18 acts as a constant current source.

The previously-mentioned control transistor Q9, having its emitter electrode connected directly to the positive power supply terminal 21 and its collector electrode connected directly to the junction point 20, is part of the load circuit for the constant current source Q18. It will be apparent that negative current can flow from the negative power supply terminal 26 through resistor 58, the emitter-collector path of transistor Q18, potentiometer 56, resistor 57 and through the collector-emitter path of control transistor Q9 to the positive power supply terminal 21.

The base electrode of the control transistor Q9 is connected through a parallel-connected capacitor 62 and resistor 63 to the positive power supply terminal 36.

A feedback transistor Q10 of the NPN type has its collector electrode connected directly to the base electrode of control transistor Q9, its base electrode connected directly to the junction point 39 at the emitters of Q13 and Q14, and its emitter electrode connected to ground through a resistor 64 and to the positive power supply terminal 21 through a resistor 65.

It will be apparent that the base of transistor Q10 is driven from the emitters of the final voltage gain stage (Q13, Q14) of the amplifier, and that the collector-emitter current through transistor Q10 drives the base of the control transistor Q9.

As already indicated, transistor Q9 is intended to be the load for the constant current source Q18, as well as a constant current source for input transistors Q5 and Q6. If there is any change in the emitter-collector current of Q9, such as due to changes in its internal characteristics, this will produce a corrective feedback through the various stages of the amplifier Q5, Q6, Q7, Q8, Q11, Q12, Q13 and Q14, to the transistor Q10, which will then change the emitter-base current of transistor Q9 to restore its emitter-collector current to the desired value.

In practice the common mode input to the two input terminals 10 and 11 of the amplifier may go as high as + or −11 volts with respect to ground, which is within the linear operating range of the input transistors Q5 and Q6 and the remaining stages of the amplifier. The present circuit insures that such common mode input cannot produce excessive leakage currents through the emitter-base junctions Q1, Q2, Q3, Q4, which would reduce the effective input impedance of the amplifier.

The voltage at junction point 20 will follow the common mode input to the amplifier. The constant current source Q18, by maintaining a constant voltage across potentiometer 56 and resistor 57, insures that the voltage at junction point 55 will follow the voltage at point 20. The emitter follower transistor Q19 causes the voltage at junction point 53 to follow the voltage at point 55. Therefore, through the voltage-following action of this circuit, the voltage at point 53 will follow the common mode input voltage to the input transistors Q5 and Q6 to insure that the voltage drop across the protection diodes Q1, Q2, and Q3, Q4 due to the common mode input is kept to an acceptably low level, so that the leakage currents through them are not high enough to lower appreciably the effective input impedance of the amplifier.

The absence of the usual resistor between the power supply terminal 21 and the emitter electrode of transistor Q9 enables the junction point 20 to follow the common mode input to a much higher voltage, positive or negative with respect to ground, than if such an emitter resistor were present. Therefore, the present circuit arrangement provides protection against higher common mode inputs than was possible heretofore.

In the event of an excessively high input voltage (either positive or negative, and either D.C. or an A.C. transient) applied to either input terminal 10 or 11, the present circuit will function to prevent damage to the input transistor Q5 or Q6 to which this overload input voltage would be applied. For example, if an excessively high positive voltage is applied to input terminal 11, at the junction point 66 between resistor 19 and the gate electrode 16 of input transistor Q5 this input voltage sees two alternative (parallel-connected) current paths, one of which includes the extremely high input impedance of transistor Q5, and the other of which includes in series the back-to-back diodes provided by Q3 and Q4, resistor 53*a*, and resistor 54, connected to the −15 volt power supply terminal 26. This latter path presents a much smaller impedance than the input impedance of input transistor Q5, and it bypasses the overload signal away from the latter in the following manner:

The base-emitter path of Q3 conducts positive current in the forward direction, the emitter-base junction of Q4 breaks down for reverse current Zener conduction at a Zener voltage of about 10 volts (which is appreciably below the breakdown voltage at which the input transistor Q5 would be damaged), and positive current flows through resistors 53*a* and 54 in series to the negative power supply terminal 26. The emitter electrode of transistor Q19 is driven positive to above the +15 volt potential of its collector electrode, so that transistor Q19 stops conducting collector-emitter current.

Conversely, if an excessively high negative voltage is applied to the input terminal 11, at point 66 the negative input current, instead of flowing through the high input impedance of transistor Q5, can flow through the lower impedance path provided by Q3, Q4, resistor 53*a*, and the emitter-collector path of transistor Q19 to the +15 volt power supply terminal. Substantially all of the negative current at point 66 will flow as reverse current through the base-emitter junction of Q3, which breaks down for Zener conduction at a breakdown voltage of about 10 volts, and in the forward direction through the emitter-base path of Q4, and through resistor 53*a* and the emitter-collector path of transistor Q19 to the positive power supply terminal 21. The transistor Q19 can reach a condition of saturation, at which the potential at its emitter electrode approaches the +15 volt potential at its collector electrode, so that substantially all of the input voltage appears across the Zener-operating base-emitter junction of Q3 and resistor 53*a*.

Similar actions take place when an excessively high input voltage, either positive or negative, and either D.C. or A.C., is applied to the other input terminal 10 of the amplifier.

Therefore, any overload voltage will be bypassed away from the respective high impedance input transistor Q5 or Q6 to avoid damage to the latter.

While a presently-preferred embodiment of the present amplifier has been described in detail with reference to the accompanying drawing, it is to be understood that various modifications, omissions and refinements which depart from the disclosed embodiment may be adopted without departing from the spirit and scope of the present invention.

Having described our invention, we claim:

1. An amplifier comprising an insulated-gate field effect transistor having a high impedance input and having an output, a pair of oppositely-biased semiconductor junctions connected in series with each other to the input of said transistor for bypassing excessively high input signals away from the latter, and means coupled to the output of said transistor and operable in response to input signals within the linear operating range of said transistor to minimize the voltage across said series-connected junctions and thereby to minimize the input leakage current through the latter.

2. An amplifier according to claim 1, and further comprising a power supply for said insulated-gate field effect transistor, a control transistor having its emitter-collector path connected as substantially the sole impedance between one of the terminals of said power supply and the corresponding output electrode of said insulated-gate field effect transistor, a constant current source connected to drive said control transistor, resistance means connected between said constant current source and said control transistor to develop a voltage which is proportional to the potential at said output electrode of the insulated-gate field effect transistor, and means for applying said developed voltage to the terminal of said series-connected semiconductor junctions which is remote from the input of the insulated-gate field effect transistor to thereby minimize the voltage across said junctions.

3. An amplifier according to claim 2, wherein each of said semiconductor junctions is the base-emitter junction of a transistor whose collector is open-circuited.

4. An amplifier according to claim 2, wherein said last-mentioned means comprises an additional transistor and resistance means connected between said additional transistor and said terminal of the semiconductor junctions.

5. An amplifier according to claim 4, wherein said additional transistor is connected for emitter follower operation.

6. An amplifier according to claim 2, wherein said last-mentioned means comprises an additional transistor having its collector connected directly to said one power supply terminal and having an emitter and a base, resistance means connected between said emitter and the other of said power supply terminals, said base being connected directly to said constant current source ahead of said resistance means across which said voltage is developed, and resistance means connected between said emitter and said terminal of the semiconductor junctions.

7. An amplifier according to claim 2, and further comprising additional amplification means connected to the output of said insulated-gate field effect transistor to amplify the output signal from the latter, and means coupled to the output of said additional amplification means and operable thereby to stabilize the current through said control transistor.

8. An amplifier according to claim 7, wherein said last-mentioned means comprises a feedback transistor having its input connected to the output of said additional amplification means and having its output connected to the base of said control transistor.

9. An amplifier according to claim 2, wherein said last-mentioned means comprises an additional transistor having its collector connected directly to said one power supply terminal and having an emitter and a base, resistance means connected between said emitter and the other of said power supply terminals, said base being connected directly to said constant current source ahead of said resistance means across which said voltage is developed, and resistance means connected between said emitter and said terminal of the semiconductor junctions, and further comprising additional amplification means connected to the output of said insulated-gate field effect transistor to amplify the output signal from the latter, and a feedback transistor having its input connected to the output of said additional amplification means and having its output connected to the base of said control transistor, said feedback transistor being operable to stabilize the current through said control transistor to compensate for any internal changes in the latter.

10. An amplifier according to claim 9, wherein each of said semiconductor junctions is the base-emitter junction of a transistor having an open-circuited collector.

11. An operational amplifier comprising first and second input transistors of the insulated-gate field effect type having their respective source electrodes connected directly to each other, a first pair of oppositely-biased semiconductor junctions connected in series with each other to the gate of the first input transistor for bypassing excessively high input signals away from the latter, a second pair of oppositely-biased semiconductor junctions connected in series with each other to the gate of the second input transistor for bypassing excessively high input signals away from the latter, said first and second pairs of series-connected junctions being connected to each other at a junction point, and means coupled to the source electrodes of said input transistors and operable in response to common mode inputs to said transistors to cause the voltage at said junction point to follow the common mode input, thereby minimizing the input leakage current through said junctions.

12. An amplifier according to claim 11, and further comprising a power supply for said input transistors, a control transistor having its emitter-collector path connected as substantially the sole impedance between one of the terminals of said power supply and the source electrodes of said input transistors, a constant current source, resistance means connected between said constant current source and said control transistor to develop a voltage which is proportional to the potential at the source electrodes of the input transistors due to the common mode input signal, and means for applying said developed voltage to said junction point between the first and second pairs of semiconductor junctions to thereby minimize the voltage across said junctions.

13. An amplifier according to claim 12, wherein each of said semiconductor junctions of each pair is the base-emiter junction of a transistor whose collector is open-circuited.

14. An amplifier according to claim 12, wherein said last-mentioned means comprises an additional transistor and resistance means connected between said additional transistor and said junction point between said first and second pairs of semiconductor junctions.

15. An amplifier according to claim 14, wherein said additional transistor is connected for emitter follower operation.

16. An amplifier according to claim 12, wherein said last-mentioned means comprises an additional transistor having its collector connected directly to said one power supply terminal and having an emitter and a base, resistance means connected between said emiter and the other of said power supply terminals, said base being connected directly to said constant current source ahead of said resistance means across which said voltage is developed, and resistance means connected between said emitter and said junction point between the first and second pairs of semiconductor junctions.

17. An amplifier according to claim 12, and further comprising additional amplificaiton means connected to the output of said input transistors to amplify the output signal from the latter, and means coupled to the output of said additional amplification means and operable thereby to stabilize the current through said control transistor.

18. An amplifier according to claim 17, wherein said last-mentioned means comprises a feedback transistor having its input connected to the output of said additional amplification means and having its output connected to the base of said control transistor.

19. An amplifier according to claim 12, wherein said last-mentioned means comprises an additional transistor having its collector connected directly to said one power supply terminal and having an emitter and a base, resistance means connected between said emitter and the other of said power supply terminals, said base being connected directly to said constant current source ahead of said resistance means across which said voltage is developed, and resistance means connected between said emitter and said junction point between the first and second pairs of semiconductor junctions, and further comprising additional amplification means connected to the output of said input transistors to amplify the latter's output, and a feedback transistor having its input connected to the output of said additional amplification means and having its output connected to the base of said control transistor, said feedback transistor being operable to stabilize the current through said control transistor to compensate for any internal changes in the latter.

20. An amplifier according to claim 9, wherein each of said semiconductor junctions is the base-emiter junction of a transistor having an open-circuited collector.

21. An amplifier comprising an insulated-gate field effect input transistor with a high input impedance, means for applying an input signal to said input transistor, and means for protecting said input transistor against excessively high input signals of either polarity comprising a pair of transistors each having a base-emitter junction and an opencircuited collector, the base-emitter junctions of said pair of transistors being oppositely connected in series with each other to said means for applying the input signal, the base-emiter junction of each transistor of said pair having a Zener breakdown voltage substantially lower than the breakdown voltage of said input transistor, whereby an excessively high input signal of either polarity produces bypass current flow in a forward direction through the base-emitted path of one transistor of said pair and Zener current through the base-emitter junction of the other transistor of said pair to prevent overloading of said input transistor.

22. An amplifier according to claim 21, and further comprising resistance means in series with the base-emitter junctions of said pair of transistors for limiting the current through the latter.

23. An amplifier according to claim 21, and further comprising a pair of power supply terminals for said input transistor, an additional transistor and first resistance means connected in series with each other between said power supply terminals, and second resistance means connected in series between the terminal of said base-emitter junctions which is remote from the input of said input transistor and the junction point between said additional transistor and said first resistance means, whereby bypass current of one polarity flows through said pair of emitter-base junctions and through said second resistance means and said first resistance means to one of said power supply terminals, and bypass current of the opposite polarity flows through said pair of emitter-base junctions and through said second resistance means and said last-mentioned transistor to the other of said power supply terminals.

24. An operational amplifier comprising first and second input transistors of the insulated-gate field effect type having their respective source electrodes connected directly to each other, first and second input terminals connected respectively to the gate electrodes of the first and second input transistors, means for protecting the first input transistor against excessive input signals of either polarity comprising a first pair of transistors each having a base-emitter junction and a collector which is open-circuited, the base-emitter junctions of said first pair being oppositely connected in series with each other to the gate electrode of the first transistor, each of said base-emitter junctions having a Zener breakdown voltage substantially lower than the breakdown voltage of said first input transistor, and means for protecting the second input transistor against excessive input signals of either polarity comprising a second pair of transistors each having a base-emitter junction and a collector which is open-circuited, the base-emitter junctions of said second pair being oppositely connected in series with each other to the gate electrode of the second transistor, each base-emitter junction of the second pair having a Zener breakdown voltage substantially lower than the breakdown voltage of said second input transistor.

25. An amplifier according to claim 24, wherein said first and second pair of base-emitter junctions are connected to each other at a first junction point, and further comprising a pair of opposite power supply terminals for said input transistors, an additional transistor and resistance means connected to each other at a second junction point and connected in series with each other across said power supply terminals, and resistance means connected between said first and second juncture points.

26. A stabilized amplifier comprising high input impedance transistor means providing a first voltage amplification stage, a second voltage amplification stage including a transistor having its input connected to the output of said first voltage amplification stage, a current amplification stage including a transistor having a grounded collector and connected for emitter-follower operation and having its input connected to the output of said second voltage amplification stage, a third voltage amplification stage including a transistor having its input connected to the output of said current amplification stage, an emitter follower transistor having its input connected to the output of said third voltage amplification stage, output transistor means having its input connected to the emitter of said last-mentioned emitter follower transistor, and means for stabilizing the amplifier comprising a first compensating capacitor connected between the output of said third voltage amplification stage and the input of said second voltage amplification stage, a second capacitor connected between the output of said third voltage amplification stage and the grounded collector of said current amplification stage, and a third capacitor connected between the emitter of said last-mentioned emitter follower transistor and the input of said third voltage amplification stage.

References Cited

UNITED STATES PATENTS

| | | | |
|---|---|---|---|
| 3,077,566 | 2/1963 | Vosteen | 330—17 X |
| 3,303,380 | 2/1967 | Kozikowski | 330—17 X |
| 3,320,430 | 5/1967 | Gorman | 307—304 X |
| 3,328,599 | 6/1967 | Stupar | 330—30 X |

ROY LAKE, Primary Examiner

JAMES B. MULLINS, Assistant Examiner

U.S. Cl. X.R.

330—30, 35